United States Patent [19]

Wilczynski

[11] 4,232,969

[45] Nov. 11, 1980

[54] PROJECTION OPTICAL SYSTEM FOR ALIGNING AN IMAGE ON A SURFACE

[75] Inventor: Janusz S. Wilczynski, Ossining, N.Y.

[73] Assignee: International Business Machines Corporation, Armonk, N.Y.

[21] Appl. No.: 43,924

[22] Filed: May 30, 1979

[51] Int. Cl.³ .................................. G01B 11/27
[52] U.S. Cl. ................................... 356/401
[58] Field of Search ............... 356/401, 400, 399, 150; 350/89

[56] References Cited

U.S. PATENT DOCUMENTS

| | | | |
|---|---|---|---|
| 1,943,509 | 1/1934 | Bauersfeld | 350/89 |
| 3,752,560 | 8/1973 | Lunn | 350/91 |
| 3,885,877 | 5/1975 | Horwath et al. | 356/400 |
| 4,062,623 | 12/1977 | Suzuki et al. | 356/401 |
| 4,153,371 | 5/1979 | Koizumi et al. | 356/400 |
| 4,165,149 | 8/1979 | Suzuki et al. | 356/400 |

OTHER PUBLICATIONS

Makosch, G. "Dark Field Illumination Device," *IBM Technical Disclosure Bulletin*, vol. 17, No. 11 (Apr. 1975) p. 3264.

Khoury, H. A. "Scattered Light Feedback Detector for Automatic Wafer Alignment," *IBM Technical Disclosure Bulletin*, vol. 18, No. 2 (Jul. 1975) p. 414.

*Primary Examiner*—John K. Corbin
*Assistant Examiner*—R. A. Rosenberger
*Attorney, Agent, or Firm*—Pollock, Vande Sande and Priddy

[57] ABSTRACT

A dark field optical alignment apparatus is described for a projection exposure system wherein a tilted plane mirror (37) having at least one elliptical hole is positioned between a pattern mask (7) and a telecentric projection objective (45) to reflect diffracted light from alignment aids on a surface out of a main optical axis of the projection exposure system. Radiation is passed through alignment aid slits in the pattern mask and is transmitted through the elliptical hole in the plane mirror to illuminate corresponding edges (13, 15, 17) of the alignment aids on a wafer. Directly reflected light from the alignment aids is focused back through the elliptical hole by the telecentric objective. Diffracted light from the alignment aid edges is passed by the outer portion of the projection objective to the reflective surface of the plane mirror which reflects the radiation to a photodetector that measures the intensity of the reflected radiation. The radiation from the alignment aid slits is scanned across the associated edges of the alignment aids until a maximum radiation intensity is detected by the photo-detector. The maximum radiation intensity indicates that the pattern mask and the wafer are in alignment.

26 Claims, 10 Drawing Figures

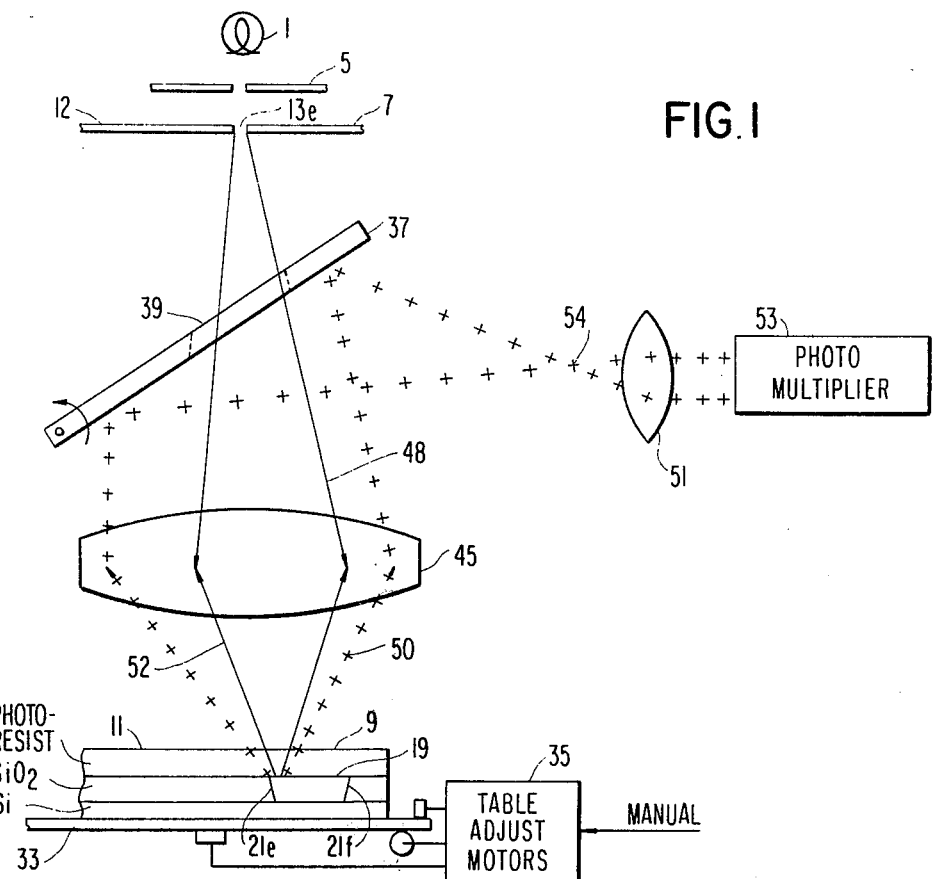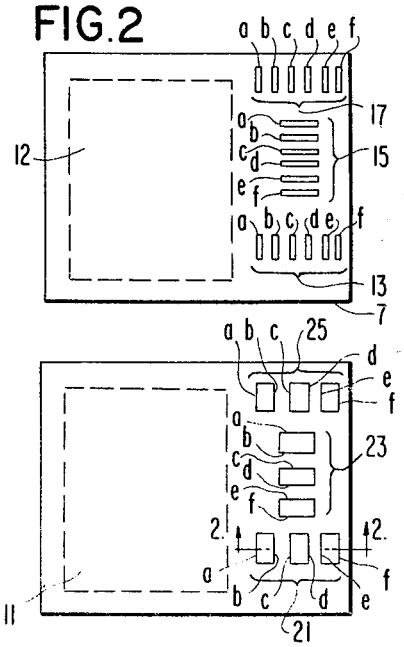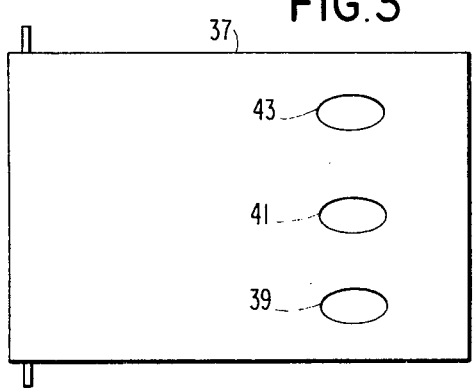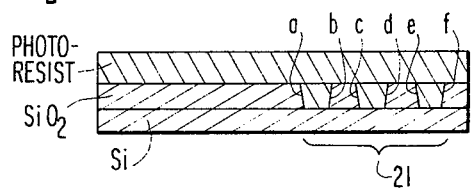

PROJECTION OPTICAL SYSTEM FOR ALIGNING AN IMAGE ON A SURFACE

DESCRIPTION

1. Technical Field

The invention relates to an improved camera for aligning a pattern mask and a wafer during lithographic steps required in manufacturing electronic components and, more particularly, to a dark field optical alignment system.

2. Background Art

It is known to the art to utilize cameras to project circuit image patterns onto wafers coated with photoresist and to process the exposed wafers to produce corresponding circuits. Such prior art cameras have used various means to align a pattern mask with a corresponding resist coated wafer in the manufacturing process. For example, one prior art camera employs a human operator to observe the position of projected alignment images with respect to corresponding alignment aids on the wafer and to manually adjust the position of an alignment table to position the images in a particular relation to the associated alignment aids. The position adjustment serves to align the pattern mask and the wafer. However, such manual alignment systems are relatively slow and, of course, are subject to human error.

Other prior art cameras employ manual alignment procedures that do not adequately correct for accumulated alignment errors due to mechanical drift in the camera itself or to alignment differences that occur if a wafer is initially aligned and exposed on one machine and is then later aligned and exposed on a different machine for a subsequent manufacturing step.

For example, prior art step and repeat cameras typically employ a manual alignment system to initially align a wafer and a corresponding mask. Thereafter, the wafer is stepped to succeeding exposure positions. However, in such prior art systems, the wafer and mask are not realigned with each step since it has not heretofore been possible to conveniently and automatically detect a step alignment error and apply a corresponding correction in the alignment of the wafer and the mask.

Various dark field illumination systems have been employed in microscopy to observe minute objects. For example, such systems are disclosed in the United States patent to Lunn, U.S. Pat. No. 3,752,560 and the United States patent to W. Baubersfeld, U.S. Pat. No. 1,943,509. In addition, dark field illumination alignment devices have been proposed in the IBM Technical Disclosure Bulletins, "Dark Field Illumination Device", Vol. 17, No. 11 (April, 1975) and "Scattered Light Feedback Detector for Automatic Wafer Alignment", Vol. 18, No. 2 (July, 1975). However, until now a practical and efficient means for utilizing dark field illumination in an automatic alignment system has not been provided.

Accordingly, it is a primary object of the invention to provide a relatively simple and effective means to align an image on an alignment surface in a projection optical system.

A further object of the invention is to provide an alignment system that may be employed to automatically align a pattern mask and wafer during a step-and-repeat exposure process.

Another object of the invention is to provide a camera that will more precisely and more rapidly align a pattern mask and a wafer.

A further object of the invention is to provide a camera that uses a more effective dark field optical alignment system to align a pattern mask with an associated alignment surface.

These and other objects of this invention will become apparent from a review of the detailed specification which follows and a consideration of the accompanying drawings.

DISCLOSURE OF INVENTION

In order to achieve the objects of the invention and to overcome the problems of the prior art, the improved camera, according to the invention, includes a source means for generating radiation and a projection mask having alignment slits for passing radiation.

The radiation from the alignment slits is passed through a corresponding hole in a plane surface mirror to a telecentric lens that focuses the radiation to form alignment slit images adjacent to alignment aids on the surface of the wafer. The light that is directly reflected from the surface of the wafer is refocused by the telecentric lens to pass back through the associated hole in the plane surface mirror. The radiation that is diffracted by the edges of the alignment aids is passed through the outer portion of the telecentric lens to the reflective surface of the plane mirror. The plane mirror reflects the radiation from the main optical path of the camera to focusing lenses and associated photo-detectors. In the most simple configurations, no focusing lenses are required. Similarly, the mirror may not be flat if a different detection scheme is used.

The photo-detectors generate signals corresponding to the intensity of the diffracted radiation that is received. An alignment table is provided to move the wafer with respect to the pattern mask so that the slit images are scanned across the associated edges of the alignment aids. The scanning is continued until a maximum light intensity is detected by the photo-detectors.

A preferred embodiment of the invention utilizes oscillating transparent plates to optically scan the slit images across the associated edges of the alignment aids. Means are provided to generate a reference pulse when an oscillating transparent plate is in a predetermined position. A corresponding peak detection registration point is defined when a photo-detector measures a peak scattered light intensity. A comparator generates an offset error signal corresponding to the time delay between the registration point and the reference pulse that are associated with each transparent plate.

The error signals are applied to drive amplifiers that operate to move the table in directions corresponding to the sign and magnitude of the error signals. When the time delay between each registration point and associated reference pulse reaches a predetermined value, the pattern mask is in alignment with the wafer.

A preferred embodiment of the invention is described wherein three groups of alignment slits are utilized to project corresponding slit images on three groups of alignment aids to provide three separate signals corresponding to the orientation of the pattern mask and the wafer with respect to X, Y and angular coordinates.

BRIEF DESCRIPTION OF DRAWINGS

FIG. 1 illustrates a diagrammatic representation of a preferred embodiment of a scanning apparatus in accordance with the invention.

FIG. 2 illustrates a top elevation view, not to scale, of a pattern mask having X, Y and angular coordinate slits according to the invention.

FIG. 3 shows a top elevation view of the light coupling optical element of FIG. 1.

FIG. 4 shows a top elevation view, not to scale, of rectangular alignment aids in the surface of a wafer in accordance with the invention.

FIG. 5 shows a sectional end view of the alignment aids of FIG. 4 along a line 2—2.

BEST MODE FOR CARRYING OUT THE INVENTION

Figure 6:
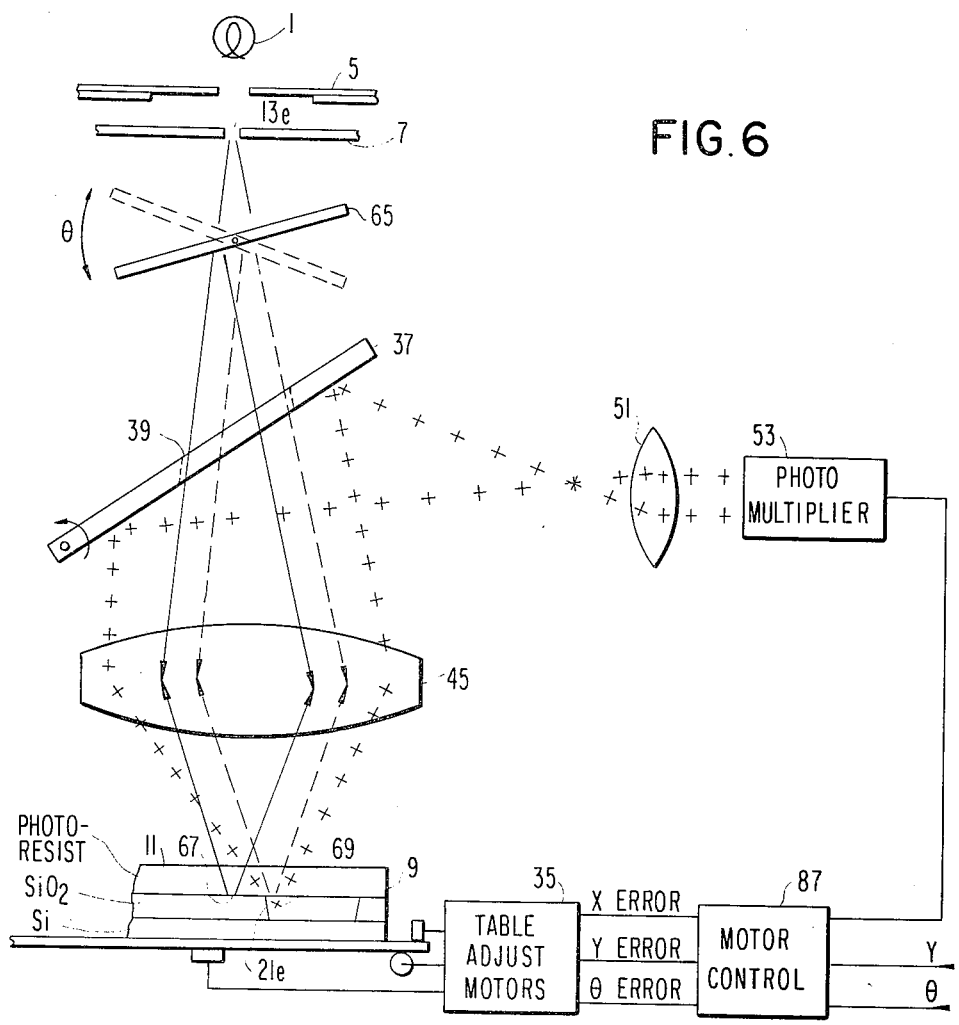
FIG. 6 shows a diagrammatic representation of an automatic scanning apparatus in accordance with the invention.

The remaining portion of this specification will describe preferred embodiments of the invention when read in conjunction with the attached drawings, in which like reference characters identify identical apparatus.

FIG. 1 shows a block diagram of a dark field optical alignment apparatus in accordance with the invention. More particularly, the apparatus of FIG. 1 may be used to precisely align a wafer with a pattern mask in a projection exposure system, for example a system utilizing a step-and-repeat camera.

FIG. 1 illustrates the relationship of the components of a camera in accordance with the invention. However, it should be understood that for the sake of clarity the components of the apparatus of the invention have not been drawn to scale. As shown in FIG. 1, a light source 1, for example a high pressure mercury arc lamp, is employed to illuminate a pattern mask 7. A diaphragm 5 is operated to pass light only to alignment slits in the pattern mask 7 during the alignment process.

After the wafer and mask are aligned, the diaphragm is removed so that the light source 1 may irradiate an additional portion of the mask to project a circuit image.

It should be appreciated that the diaphragm is necessary in the alignment process only if the resist surface of the wafer is sensitive to the radiation that is passed through the alignment slits of the mask 7. Accordingly, the diaphragm may be eliminated if a filter or other suitable means is employed during the alignment process to generate radiation that does not affect the resist surface of the wafer.

In manufacturing circuits, the pattern mask 7 is used to project a circuit image upon the surface of a corresponding resist coated wafer 9 that typically has a base layer, for example of silicon, an intermediate layer, for example of silicon oxide, and a topmost layer of photoresist material. The projected image from the pattern mask 7 exposes photo-sensitive portions on the surface of the photosensitive wafer 9 and, thereafter, chemical processes known to the art are employed to produce a circuit pattern on the wafer 9 that corresponds to the light image that was projected.

Since several processing steps are typically required to produce a particular circuit pattern on a wafer, it is necessary to provide a means to precisely align the pattern mask 7 with the wafer 9 before an integrated circuit portion 11 of the wafer is exposed.

As shown in FIG. 2, a preferred embodiment of the invention utilizes a pattern mask that may include three separate alignment slit portions. Each of these alignment slit portions is used to align the wafer 9 and the mask 7 in a particular coordinate orientation. As shown in FIG. 2, an X-coordinate portion 13 of the mask may include three pairs of slits having respective designations 13a, b, c, d, e and f. These X-coordinate slits will pass radiation from the light source 1 to form corresponding images of slits on the wafer 9.

Likewise, a Y-coordinate portion 15 may include six slits 15a, b, c, d, e and f. Of course, these particular slits are used to align the mask 7 and wafer 9 in a Y-coordinate orientation. Although an X-Y rectangular coordinate alignment is sufficient for many purposes, a more accurate alignment is obtained by utilizing a third angular alignment portion 17 for providing a typically small angular correction when aligning the mask 7 and the wafer 9.

FIG. 4 illustrates three wafer alignment aid portions that correspond to the pattern mask slit portions 13, 15 and 17. As can be seen from an examination of FIG. 4, the X alignment aid portion 21 of the wafer 9 corresponds to the X-coordinate slit portion 13a-f of the pattern mask 7 of FIG. 2. More particularly, in accordance with the invention, the slits 13a and 13b correspond to the lateral edges 21a and 21b of the rectangular pattern on the wafer 9. Likewise, the slits 13c and 13d correspond to the lateral edges 21c and 21d and the slits 13e and 13f correspond to the lateral edges 21e and 21f.

A Y-alignment aid portion 23 of the wafer 9 also has lateral edges 23a-f corresponding to the associated slits 15a-f of the Y-coordinate portion 15 of the pattern mask 7 and an angular alignment portion 25 may also be included on the wafer 9 to provide an angular alignment with the corresponding slits of the angular alignment slit portion 17 of the pattern mask 7.

It should be understood that each of the rectangular alignment patterns of the wafer 9 are formed by rectangular indentations in the surface of the wafer 9. FIG. 5 shows a sectional view of the X-alignment aid portion 21 taken along a line 2—2 in the indicated direction.

Each rectangular indentation has corresponding edges 21a-21f. It should be appreciated that the alignment indentations in the alignment portions 21, 23 and 25 may be formed by methods known to the art. For example, the wafer 9 may be initially roughly positioned with respect to an alignment aid creation mask having rectangular openings of the same size, shape and location as the rectangular patterns shown in FIG. 4. A light source is then used to illuminate the alignment aid creation mask to project corresponding rectangular images on photo-sensitive peripheral portions of a wafer. Thereafter, the exposed wafer is processed in a manner known to the art to etch the indentations of FIG. 5. A layer of transparent photo-resist is then applied to the surface of the wafer to prepare the wafer for subsequent alignment and circuit printing exposures. In most cases this special masking operation may be avoided and the alignment indentations may be made during the first masking operation. Of course, additional indentations may be generated during later parts of the process.

For the sake of simplicity, the pattern mask 7 of FIG. 1 has been shown with a single slit corresponding to the slit 13e of the X-coordinate portion 13 of FIG. 2. Likewise, the wafer 9 has been shown with a single corresponding alignment indentation 19 having edges 21e and 21f. It should be appreciated that the wafer 9 and alignment indentation 19 of FIG. 1 and the corresponding pattern mask 7 and X-coordinate slit 13e have been shown greatly enlarged with respect to the other components of the apparatus of the invention in order to more clearly illustrate the features of the invention. In a preferred embodiment of the invention, the alignment slits of the pattern mask 7 may be on the order of 2 microns in width, 20 microns in length and 6 to 10 microns apart, when measured in the wafer plane.

In operation, a wafer 9 having the alignment aid indentations as illustrated in FIG. 4 and FIG. 5 is positioned on an alignment table 33 that may be constructed in a manner known to the art. For example, such a table is disclosed in the U.S. patent to Brady et al, U.S. Pat. No. 3,870,416. Such alignment tables are used to move the wafer in small incremental distances in X, Y or angular directions. Although the apparatus of the invention is not limited to operation with a particular type of alignment table, for maximum accuracy a preferred embodiment of the invention may include a table utilizing a laser interferometer to control its movement. Thus, appropriate alignment table movement apparatus 35 is provided to move the table in the X and Y directions and in an angular direction, if required. However, the alignment may also be achieved by rotating the mask.

After the wafer 9 has been placed on the alignment table 33 and a corresponding pattern mask 7 having alignment slits as illustrated in FIG. 2 has been placed in position, the pattern mask 7 and wafer 9 are roughly aligned and the diphragm is opened to illuminate the mask with radiation from the light source so that light is passed through the alignment slits in the X, Y and angular coordinate portions 13-17. The transmitted radiation illuminates the opaque top surface of a light coupling optical element 37, for example a plain surface mirror pivotally mounted to move into the optical column of the camera during the alignment process and to move out of the optical column after alignment is completed. Radiation from the X, Y and angular coordinate portions 13-17 of the mask is passed through corresponding openings, for example elliptical openings, in the optical element 37.

FIG. 3 illustrates a top view of the light coupling optical element 37. A bottom opening 39 is positioned to pass the radiation that is transmitted through the slits 13a-f of the pattern mask 7. Likewise, a middle opening 41 is positioned to pass the radiation from the slits 15a-f and a top opening 43 is positioned to pass radiation from the slits 17a-f.

Radiation is passed through the elliptical holes in the light coupling optical element 37 to a portion of the full entrance pupil of a telecentric projection lens 45. In accordance with the invention, the dimensions of the openings 39, 41 and 43 and the position of the light coupling optical element 37 are such that only approximately ½ of the full aperture of the entrance pupil of the projection lens 45 receives the radiation that is transmitted through the openings 43, 39 and 41. Of course, it should be appreciated that the position and opening size of the light coupling element 37 may be changed to either increase or decrease the portion of the entrance pupil of the projection lens 45 that is utilized to pass the alignment radiation. Also, in accordance with the Babinet principle, an equivalent system may be used wherein the plane of the mirror is transparent and the holes are replaced by elliptical mirrors.

The radiation 48 that passes from the slit 13e and through the opening 39 is focused by the telecentric projection lens 45 in an area corresponding to an edge 21e of the indentation 19. It occupies approximately a width equal to the wavelength of light divided by the numerical aperture of the illuminating beam. As shown in FIG. 1, a portion 50 of this radiation is diffracted by the edge 21e and passes through the outer portion of the telecentric lens 45. The diffracted radiation is reflected by the reflective surface of the light coupling optical element 37 and is focused by the lens 45 at a position 54. A radiation intensity measuring device, for example a lens 51 and a photo-multiplier 53, receives the diffracted radiation and generates a signal corresponding to the intensity of the radiation. Another portion 52 of the radiation 48 is reflected back through the opening 39.

It should be appreciated that the radiation intensity that is registered by the photo-multiplier 53 corresponds to the amount of radiation that is diffracted by the edge of the indentation 19 of the wafer 9. Also, it should be understood that the invention is not limited to a particular apparatus for measuring radiation intensity. For example, for some applications the lens 51 may be omitted and, in addition, other radiation intensity measuring devices may be used.

Moreover, the lens 51 and photomultiplier 53 may be replaced by a viewing apparatus for a human operator. In such a system, the operator manually aligns the alignment images of the pattern mask with the corresponding alignment marks on the wafer.

Accordingly, if the alignment table 33 is scanned in the X-coordinate direction over a small range, the photo-multiplier 53 will measure a peak radiation intensity that corresponds to the relative alignment of the slit 13e of the pattern mask 7 with respect to the corresponding edge 21e of the indentation 19 of the wafer 9. Thus, a peak diffracted radiation intensity indicates an alignment of the mask 7 and wafer 9. In practice, the inevitable small inclination of the alignment edges and the small displacement errors caused by over or under etching make it advisable to employ pairs of alignment slits that compensate for each other. Also, multiple pairs of slits may be used to increase sensitivity. Although the operation of the apparatus of the invention of FIG. 1 has been described with respect to a single X-coordinate slit and a single associated indentation 19, it should be appreciated that in actual operation all of the slits in X-coordinate portion 13 of the mask 7 will be simultaneously scanned across associated edges of rectangular indentations of the X-alignment aid portion 21. Likewise, the slits of the Y-coordinate portion 15 of the pattern mask 7 will be scanned across the associated edges of rectangular indentations of the Y-alignment aid portion 23 of the wafer 9. If an angular adjustment is used, the alignment table 33 will also be moved in an angular direction to scan the slits of the angular alignment portion 17 of the pattern mask 7 across the corresponding edges of rectangular indentations of the angular alignment portion 25 of the wafer 9.

It should be appreciated that the light coupling optical element 37 need not utilize elliptically shaped openings to pass the radiation from the associated alignment slits. Openings having a particular shape, for example square or rectangular, may be used, depending upon the position of the element and the configuration of the alignment aids.

In addition, it should be understood that, in accordance with the invention, all or part of the photoresist that covers that alignment indentations may be removed to facilitate the measurement of the radiation that is diffracted by the alignment edges.

The embodiment of FIG. 1 utilizes the table 33 to physically move the wafer 9 in order to scan the alignment slit images across the associated edges of the alignment aids on the wafer. It has been determined that at least one complete scan is generally required to align the pattern mask 7 and the wafer 9. Since the scan is performed by mechanical motion, the time for the scan will typically last several tenths of a second. While a scan of this type may be satisfactory for some applications, it is generally not suitable for an efficient manufacturing system. Accordingly, FIG. 6 illustrates a preferred embodiment of the invention wherein an optical scanning means is provided to rapidly and automatically scan an alignment image across associated alignment edges on the wafer 9 to align the mask and wafer.

As shown in FIG. 6, a transparent deflector plate 65, for example of glass, is positioned between the pattern mask 7 and the light coupling optical element 37 and is mounted for rotation about an axis perpendicular to the optical axis of the alignment cone of radiation and parallel to the plane of the pattern mask 7. In operation, the deflector plate 65 is oscillated through an angle $\theta$ to deflect the radiation passing through a slit, for example 13e, of the pattern mask 7. Thus, a particular position of the deflector plate 65 determines the corresponding location 67 of the image of the slit 13e on the surface of the photoresist of the wafer 9 or on the surface of a wafer having the photoresist either partially or totally removed from the alignment aids. As the deflector plate 65 rotates an angular distance about its axis, the image of the slit 13e is moved a corresponding distance along the stationary wafer 9 to an adjacent position 69.

It should be appreciated that as the radiation from the slit 13e is scanned across the face of the wafer 9 in the vicinity of the edge 21e, varying amounts of directly reflected and diffracted radiation will be generated at the surface of the wafer 9. Thus, as the projected image of the slit 13e is optically scanned across the surface of the wafer 9 in the vicinity of the edge 21e by the angular movement of the deflector plate 65, the photo-multiplier 53 will receive radiation that varies in intensity.

For the sake of clarity, FIG. 6 illustrates a single deflector plate 65 and a single slit 13e, however, it should be appreciated that as the plate 65 oscillates, the images from the slits 13a–13f of the X-coordinate portion 13 of the mask 7 will be scanned across corresponding edges 21a–21f of the rectangular indentation on the X-alignment aid portion 21 of the wafer 9. In addition, with reference to FIG. 7, it should be understood that an additional oscillating plate 71 may be included to scan the images of the slits of the Y-coordinate portion 15 of the mask across Y-alignment aids on the wafer. A deflector plate 73 may also be included to scan the images of the slits of the angular alignment portion of the mask across corresponding angular alignment aids of the wafer 9.

Each of the deflector plates 65, 71 and 73 may be oscillated by corresponding motors 75, 77 and 79. It has been experimentally determined that the thickness of each plate should be approximately 1 mm in order to provide an adequate deflection of the alignment radiation without interferring with the focusing of the mask images on the wafer. This thickness is approximate for a telecentric objective of about 0.30 numerical aperture and 5 times reduction.

Galvanometer-type scanners using oscillating transparent plates to deflect radiation are known to the art and are commercially available. For example, a Leitz Edge Detect scanner utilizes such a scanning technique to optically deflect a beam of light across an edge to detect the presence of the edge.

Figure 7:
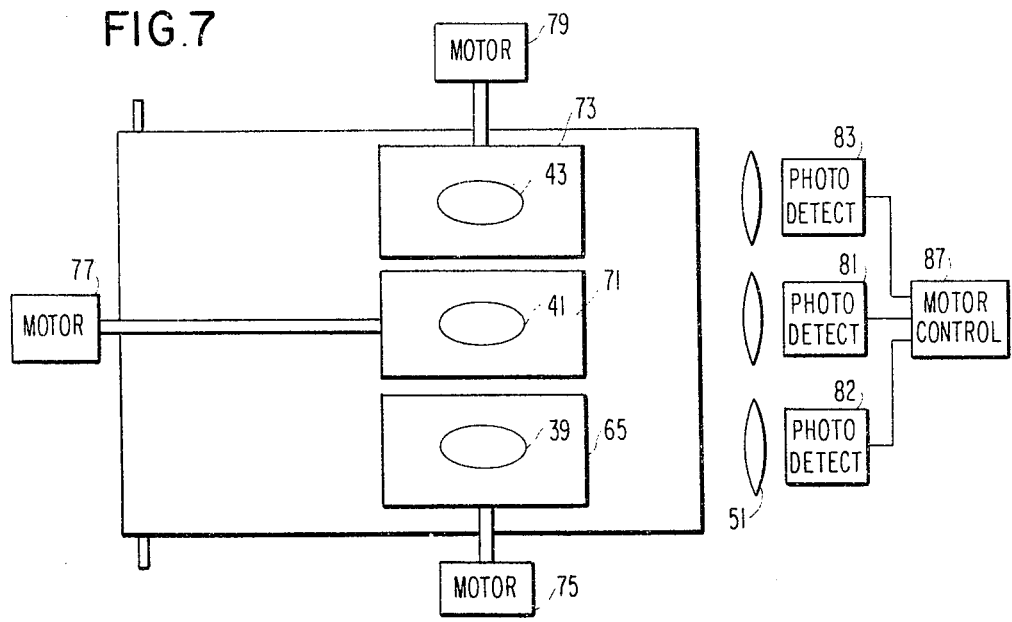
FIG. 7 shows a top elevation view of the light coupling optical element, photo-detector apparatus and oscillating plates of FIG. 1.

In accordance with the invention, the mask 7 and wafer 9 may be initially placed in rough alignment and, thereafter, as the X-coordinate alignment images are optically scanned across associated edges on the wafer 9, the photo-detector 82 will detect a corresponding peak scattered radiation intensity when each slit image coincides with its associated alignment edge. Referring now to FIG. 7, it can be seen that a photo-detector 81 will likewise register a maximum scattered light intensity when the associated slits 15a–15f project images that are positioned over the edges 23a–23f. Also, a photo-detector 83 will detect a maximum light intensity when the slits 17a–17f are in alignment with the edges 25a–25f.

Figure 8:
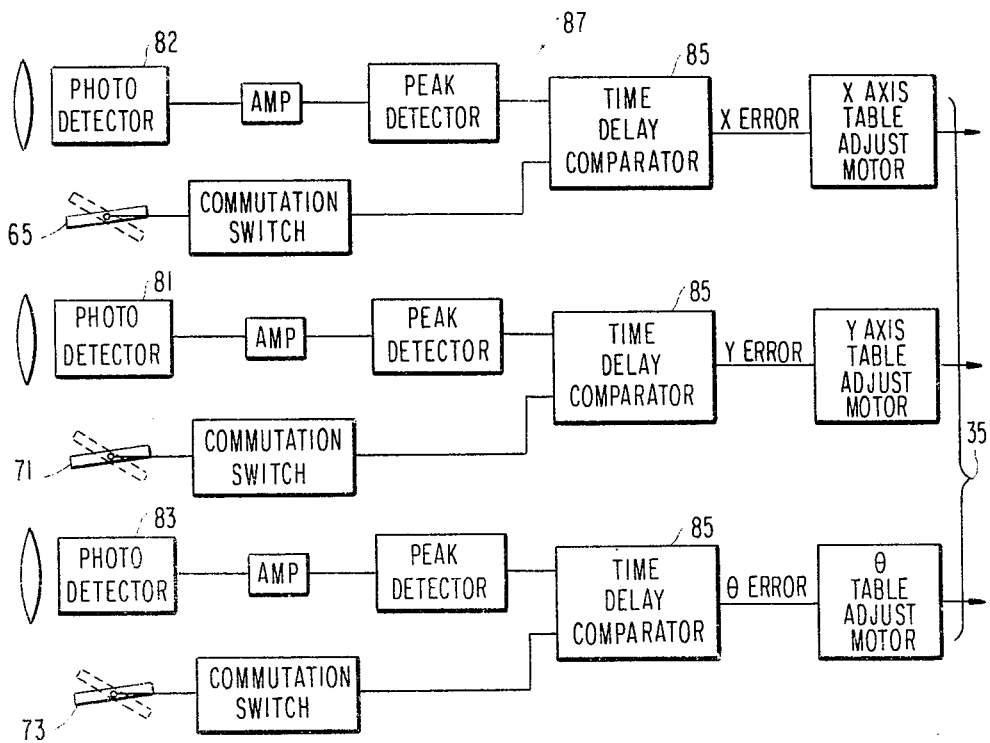
FIG. 8 shows a block diagram of the control circuitry for the table and/or mark adjusting motors of FIG. 7.

In the motor control circuit 87 of FIG. 8, the voltage signals that are generated by the photo-detectors 81, 82 and 83 are applied to respective amplifiers and peak detection circuits and a registration point is defined for the peak voltage that is measured at each detector.

A registration point corresponds to the angular position of a deflector plate when a peak voltage is sensed at an associated detector. Thus, as each deflector plate is oscillated, the measured detector voltages may be plotted against their associated deflector plate angles to produce a voltage intensity curve having a maximum at a particular angle corresponding to the registration point.

In accordance with the invention, if the signal to noise ratio of the detector voltage is fairly high, a Schmitt trigger may be employed to trigger at a particular threshold voltage and thereby generate a registration pulse at the leading and trailing edges of the voltage intensity curve. The point in time at which each registration pulse is generated will define a particular angular position of the deflector plate and the angular positions so defined will bracket a particular angular position at which the detected voltage is a maximum, corresponding to the registration point.

As each deflection plate is oscillated, an associated commutation switch generates a reference pulse when the scanning plate is at a particular reference position, for example when the plate is positioned such that is does not translate the image. Thus, the registration pulses define the angular position of a plate at a threshold maximum voltage that brackets the theoretical maximum voltage at a registration point and the reference pulse defines the point in time at which the plate is positioned to cause no translation of the image. It should be understood that the time delay between the midpoint of the registration pulses and the reference pulse is proportional to the misalignment displacement of the wafer 9 with respect to the pattern mask 7. If the position of the wafer with respect to the mask is adjusted to reduce the time delay between the midpoint of the registration pulses and the reference pulse, the mask and wafer will be more closely aligned.

It should be understood that means other than a commutation switch may be employed to generate a reference pulse when the deflector plate is at a particular angular position. For example, if a periodic ramp voltage is employed to drive the motor that oscillates the deflector plate, the ramp voltage defines the angular position of the oscillating plate at any point in time and, therefore, the ramp voltage may be applied to a Schmitt trigger to generate the reference pulse.

Time delay comparators 85 are employed to compare the midpoint between the registration pulses (which corresponds to the peak) and the reference pulse associated with each deflector plate and to generate a corresponding offset error signal.

The offset error signal is applied as an analog voltage to an associated driving amplifier of a laser interferometer-controlled alignment table 33 to move the table in the coordinate direction indicated by the sign and magnitude of the error. Of course, an error signal is generated in the above-described manner for each coordinate direction in order to move the alignment table toward an alignment position.

The error signals are generated and the alignment table is moved in corresponding coordinate directions until the time delay for each coordinate direction is zero or near zero.

Greater precision in determining the registration point or maximum voltage may be achieved if additional Schmitt triggers are used to trigger at different threshold voltages. For example, two Schmitt triggers may be employed in the above-described manner to produce four registration pulses corresponding to four plate angles. The registration pulses and reference pulse may then be used to define an associated average time delay.

If the signal to noise ratio for the detected voltage is small, it may be necessary to determine the registration point or maximum voltage by storing a digital representation of the magnitude of the detector voltage that is measured at several angular positions of a deflector plate. Thereafter, a known curve fitting procedure may be employed to define the most probable intensity curve as a function of position. The zero crossing of the first derivative of the curve with respect to angle may then be employed to determine the peak of the voltage intensity curve and the corresponding registration point for the curve. The time delay between the registration point and the reference pulse may be used to position the table in the previously described manner.

Although X, Y and angular coordinate alignment means have been described in combination, it should be appreciated that the apparatus of the invention may be easily adapted to align the pattern mask and wafer in only a single coordinate direction or two or more coordinate directions. Thus, for example, the invention may be embodied in a scanning system including apparatus for aligning the pattern mask and the wafer in only the X and Y coordinate directions, the angular direction being adjusted by other means.

Figure 9:
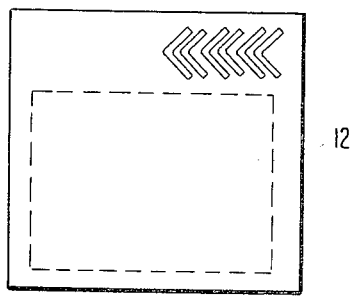
FIG. 9 shows a top elevation view, not to scale, of a pattern mask having chevron-shaped alignment slits.
Figure 10:
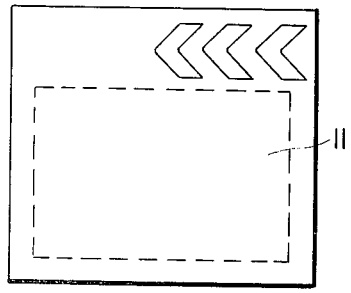
FIG. 10 shows a tep elevation view, not to scale, of chevron-shaped alignment aids in the surface of a wafer.

It should also be appreciated that although barshaped slits and corresponding rectangular indentations have been disclosed as alignment aids, in accordance with the invention, alignment aids of other shapes could also be employed without departing from the spirit of the invention. For example, as shown in FIGS. 9 and 10, chevron-shaped slits may be positioned in the pattern mask 7 and corresponding chevron-shaped indentations having chevron-shaped edges may be formed in the wafer 9. Although the apparatus of the invention would necessarily require additional processing circuitry to provide an X and Y coordinate alignment with such chevron-shaped alignment aids, it should be appreciated that such additional circuitry could be employed as a simple matter of design by those skilled in the art without departing from the spirit of the invention.

It should also be understood that although embodiments have been disclosed for moving the slit images or moving the wafer to scan the images across the wafer, any means for producing relative movement between the images of the pattern mask 7 and the wafer 9 may be employed without departing from the spirit of the invention. For example, the mask 7 itself may be moved to accomplish the scanning function.

The invention may be embodied in other specific forms without departing from its spirit or essential characteristics. The present embodiments are, therefore, to be considered in all respects as illustrative and not restrictive, the scope of the invention being indicated by the claims rather than by the foregoing description and all changes which come within the meaning and range of equivalents of the claims are therefore intended to be embraced therein.

Having thus described my invention, what I claim is new, and desire to secure by Letters Patent is:

1. A projection optical apparatus for aligning an image on a surface having at least one alignment edge, comprising:

source means for generating source radiation;

mask means for interrupting said source radiation and passing at least an alignment portion of said source radiation;

light coupling means having at least one radiation transparent portion for passing said alignment portion of source radiation in a projection direction and passing in an opposite direction a portion of radiation reflected from the surface; said light coupling means having a radiation transfer means for transmitting source radiation that is diffracted by said at least one alignment edge;

lens means for focusing said alignment portion of said source radiation to form at least one alignment image on said surface and for focusing the radiation reflected from the surface to pass through said at least one radiation transparent portion of said light coupling means, and for focusing to a separate location the radiation diffracted by said at least one alignment edge; and alignment means for moving said at least one alignment image relative to said at least one alignment edge and monitoring the intensity of said diffracted radiation, and for aligning said surface with respect to said mask means at an alignment position defined by a maximum intensity of said diffracted radiation.

2. The projection camera of claim 1 wherein said alignment means includes, detector means for receiving the diffracted radiation transmitted by said radiation transfer means and for generating a detector signal corresponding to the intensity of the diffracted radiation; and positioning means for aligning said surface with respect to said mask means at a position defined by a maximum detector signal.

3. The projection camera of claim 1 wherein said at least one radiation transparent portion is an opening passing through said light coupling means.

4. The projection camera of claim 3 wherein said opening is substantially ellipsoidal in shape.

5. The projection camera of claim 3 including means for pivotally supporting said light coupling means at a fixed position between said lens means and said mask means.

6. The projection camera of claim 5 wherein said light coupling means includes a plane surface mirror having at least one hole passing therethrough.

7. The projection camera of claim 1 wherein said lens means is a telecentric lens.

8. The projection camera of claim 7 wherein said light coupling means is positioned to pass a cone of source radiation through said at least one transparent portion to illuminate ½ of the full entrance pupil of said telecentric lens.

9. The projection camera of claim 1 wherein said alignment means includes means for moving said wafer with respect to a stationary alignment image.

10. The projection camera of claim 1 wherein said mask means includes a plurality of pairs of spaced slits for passing source radiation to form a corresponding plurality of pairs of alignment images, and said surface includes a plurality of pairs of alignment edges.

11. The projection camera of claim 10 wherein said plurality of pairs of spaced slits are arranged in at least a first and a second group, said first group positioned to define a first coordinate orientation and said second group positioned to define a second coordinate orientation, the corresponding alignment edges on said surface being positioned in matching first and second coordinate orientation patterns.

12. The projection camera of claim 11 wherein said first group of pairs of spaced slits is positioned for an X-coordinate orientation and said second group is positioned for a Y-coordinate orientation, said first and second coordinate groups establishing a rectangular coordinate alignment between said mask means and said surface when the alignment images associated with said X and Y coordinate groups illuminate corresponding alignment edges on said wafer.

13. The projection camera of claim 12 including a plurality of pairs of spaced slits positioned in a third coordinate group to define an angular orientation, said third coordinate group establishing an angular alignment between said mask means and said surface when alignment images associated with said third coordinate group illuminate corresponding alignment edges on said wafer.

14. The projection camera of claim 13 wherein said alignment means includes an angular coordinate deflector means for deflecting the radiation of said third coordinate group of alignment images to scan said third coordinate group of images across said corresponding alignment edges.

15. The projection camera of claim 14 wherein said angular coordinate deflector includes a transparent deflector plate disposed between said mask means and said light coupling means and oscillated about an axis parallel to the plane of said mask means to deflect the radiation of said third coordinate group of alignment images by an amount corresponding to the angular position of the deflector plate.

16. The projection camera of claim 15 wherein said alignment means includes, detector means for receiving the diffracted radiation transmitted by said radiation transfer means and for generating a detector signal corresponding to the intensity of the diffracted radiation, and positioning means for aligning said surface with respect to said mask means at a position defined by a maximum detector signal.

17. The projection camera of claim 16 wherein said alignment means further includes, signal means for generating an angular reference signal when the angular coordinate deflector plate is positioned so that said angular coordinate group of alignment images is not deflected, alignment measurement means for detecting a peak detector signal corresponding to the coincidence of said angular coordinate alignment images and associated alignment edges and defining a corresponding angular registration point, and wherein said positioning means includes means for moving said surface with respect to said mask means an angular coordinate distance corresponding to the time delay between said angular reference signal and said angular registration point to align said surface and said mask means.

18. The projection camera of claim 13 wherein said light coupling means includes an opening for passing the source radiation that is transmitted through the pairs of slits of said third coordinate group.

19. The projection camera of claim 12 wherein said alignment means includes X-coordinate deflector means for deflecting the radiation of said first coordinate group of alignment images to scan said first coordinate group of images across said corresponding alignment edges, and Y-coordinate deflector means for deflecting the radiation of said second coordinate group of alignment images to scan said second coordinate group of images across said corresponding alignment edges.

20. The projection camera of claim 19 wherein said X-coordinate deflector and said Y-coordinate deflector each include a transparent deflector plate disposed between said mask means and said light coupling means, and oscillated about an axis parallel to the plane of said mask means to deflect the radiation of an associated coordinate group of alignment images by an amount corresponding to the angular position of the deflector plate.

21. The projection camera of claim 20, wherein said alignment means includes, detector means for receiving the diffracted radiation transmitted by said radiation transfer means and for generating a detector signal corresponding to the intensity of the diffracted radiation; and positioning means for aligning said surface with respect to said mask means at a position defined by a maximum detector signal.

22. The projection camera of claim 21 wherein said alignment means further includes, signal means for generating a first reference signal when the oscillating X-coordinate deflector plate is positioned so that said first coordinate group of images is not deflected and for generating a second reference signal when the oscillating Y-coordinate deflector plate is positioned so that said second coordinate group of images is not deflected, alignment measurement means for detecting a first peak detector signal corresponding to the coincidence of said X-coordinate alignment images and associated X-coordinate alignment edges and defining a corresponding first registration point, said alignment measurement means including means for detecting a second peak detector signal corresponding to the coincidence of said Y-coordinate alignment images and associated Y-coordinate alignment edges and defining a corresponding second registration point, and wherein said positioning means includes means for moving said surface with respect to said mask means an X-coordinate distance corresponding to the time delay between said first reference signal and said first registration point and a Y-coordinate distance corresponding to the time delay between said second reference signal and said second registration point to align said surface and said mask means.

23. The projection camera of claim 22 wherein said positioning means includes a laser interferometercontrolled X/Y-table for moving said surface in X and Y coordinate directions with respect to said mask means.

24. The projection camera of claim 12 wherein said light coupling means includes a first opening for passing the source radiation that is transmitted through the pairs of slits of said first coordinate group, and a second opening for passing the source radiation that is transmitted through the pairs of slits of said second coordinate group.

25. A method for aligning alignment images projected by a camera with associated alignment edges etched in the surface of a wafer, comprising the steps of, placing a mask having coordinate alignment slits into a projection position on said camera, placing said wafer on an alignment table of said camera, moving the alignment table in at least two coordinate directions to position the wafer in a dead reckoning alignment position with respect to the mask, rotating into an alignment position a light coupling mirror having at least two openings passing therethrough, turning on a radiation source to illuminate at least the coordinate alignment slits of the mask, transmitting radiation through the alignment slits and associated openings in the light coupling mirror to a portion of a telecentric lens, focusing the transmitted radiation as alignment images on the surface of the wafer, focusing the radiation reflected from the surface of the wafer through the openings in the light coupling mirror, transmitting to the reflective surface of the light coupling mirror the radiation that is diffracted by said alignment edges, reflecting the diffracted radiation, measuring the intensity of the reflected radiation, moving the alignment table in at least two coordinate directions until a peak intensity of reflected radiation is measured.

26. An automatic method for aligning alignment images projected by a camera with associated alignment images etched in the surface of a wafer, comprising the steps of, placing a mask having coordinate alignment slits into a projection position on said camera, placing the wafer on an alignment table of said camera, moving the alignment table in at least two coordinate directions to position the wafer in a dead reckoning alignment position with respect to the mask, rotating into an alignment position a light coupling mirror having at least two openings passing therethrough, turning on a radiation source to illuminate at least the coordinate alignment slits of the mask, transmitting source radiation through groups of alignment slits in the mask, each group corresponding to a particular coordinate alignment direction, deflecting the transmitted source radiation for each group of alignment slits an amount corresponding to the angular position of an associated oscillating transparent plate, generating a reference signal for each oscillating transparent plate when the plate is positioned so that its associated source radiation is not deflected, passing the deflected source radiation for each alignment group of slits through an associated opening in the light coupling mirror to a telecentric lens, focusing the deflected radiation for each alignment group as scanning alignment images on the surface of the wafer, focusing the radiation reflected from the surface of the wafer through the openings in the light coupling mirror, passing to the reflective surface of the light coupling mirror the radiation that is diffracted by the alignment edges, reflecting the diffracted radiation for each alignment group of slits to a corresponding photo-detector, defining a registration point for each photo-detector corresponding to the peak intensity of diffracted radiation detected by the detector, generating an offset error signal that is proportional to the time delay between the times of occurrence of each reference signal and the associated registration point, and applying the offset error signals to move the alignment table in corresponding coordinate alignment directions.

* * * * *